(12) United States Patent
Morandini et al.

(10) Patent No.: US 9,077,282 B2
(45) Date of Patent: Jul. 7, 2015

(54) DEVICE OF VARIABLE CAPACITANCE

(71) Applicants: STMicroelectronics S.A., Montrouge (FR); International Business Machines Corporation, Armonk, NY (US)

(72) Inventors: Yvan Morandini, Chambery (FR); Romain Debrouke, le Sappey en Chartreuse (FR)

(73) Assignees: STMicroelectronics S.A., Montrouge (FR); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/745,634

(22) Filed: Jan. 18, 2013

(65) Prior Publication Data
US 2013/0181785 A1     Jul. 18, 2013

(30) Foreign Application Priority Data

Jan. 17, 2012   (FR) ...................... 12 50442

(51) Int. Cl.
| | | |
|---|---|---|
| *H03B 5/12* | (2006.01) | |
| *H03B 28/00* | (2006.01) | |
| *H03H 11/00* | (2006.01) | |
| *H03J 3/20* | (2006.01) | |

(52) U.S. Cl.
CPC .................. *H03B 28/00* (2013.01); *H03B 5/12* (2013.01); *H03H 11/00* (2013.01); *H03J 3/20* (2013.01); *H03B 5/1228* (2013.01); *H03B 5/1212* (2013.01); *H03B 5/1265* (2013.01); *H03B 5/1253* (2013.01)

(58) Field of Classification Search
CPC ............ H03B 5/12; H02M 3/06; H03K 17/16
USPC ............... 363/89; 323/283; 331/36 C, 177 V; 327/337; 438/379; 257/595
See application file for complete search history.

(56) References Cited

U.S. PATENT DOCUMENTS

| | | | |
|---|---|---|---|
| 6,013,958 A * | 1/2000 | Aytur ............................ 307/109 |
| 6,226,506 B1 * | 5/2001 | Welland et al. ............... 455/260 |
| 6,249,458 B1 | 6/2001 | Shokouhi et al. | |
| 6,753,738 B1 | 6/2004 | Baird | |
| 7,982,548 B2 | 7/2011 | Athas | |
| 8,222,963 B2 | 7/2012 | Nakamura | |
| 8,288,895 B2 * | 10/2012 | Yoon et al. .................... 307/109 |
| 8,351,232 B2 * | 1/2013 | Zhang ............................. 363/89 |
| 8,514,028 B2 | 8/2013 | Ding et al. | |
| 2002/0044012 A1 | 4/2002 | Otsuka et al. | |
| 2002/0171499 A1 | 11/2002 | Momtaz et al. | |
| 2006/0255865 A1 | 11/2006 | Li | |

(Continued)

OTHER PUBLICATIONS

French Search Report and Written Opinion dated Aug. 9, 2012 from corresponding French Application No. 12/50442.

(Continued)

*Primary Examiner* — Arnold Kinkead
(74) *Attorney, Agent, or Firm* — Seed IP Law Group PLLC

(57) ABSTRACT

A variable capacitance device including: first and second transistors coupled in series by their main current nodes between first and second nodes of the device, a control node of the first transistor being adapted to receive a first control signal, and a control node of the second transistor being adapted to receive a second control signal; and control circuitry adapted to generate the first and second control signals from a selection signal.

25 Claims, 3 Drawing Sheets

(56) References Cited

U.S. PATENT DOCUMENTS

2007/0075791 A1  4/2007  Dedieu et al.
2010/0214715 A1  8/2010  Thaller

OTHER PUBLICATIONS

French Search Report and Written Opinion dated Aug. 9, 2012 from related French Application No. 12/50438.
Staszewski, R.B., et al. A Digitally Controlled Oscillator in a 90nm Digital CMOS Process for Mobile Phones, IEEE Journal of Solid-State Circuits, vol. 40, No. 11, Nov. 1, 2005, pp. 2203-2211, XP002681603.
Waheed K et al: Characterization of Deep-Submicron Varactor Mismatches in a Digitally Controlled Oscillator, Custom Integrated Circuits Conference, 2005, Proceedings of the IEEE 2005, IEEE, Piscataway, NJ, USA, Sep. 18, 2005, pp. 605-608, XP010873599.
Maget, Judith et al: Influence of Novel MOS Varactors on the Performance of a Fully Integrated UMTS VCO in Standard 0.25-um CMOS Technology, IEEE Journal of Solid-State Circuits, IEEE Service Center, Piscata Way, NJ, USA, vol. 37, No. 7, Jul. 1, 2002, XP011065798.

* cited by examiner

DEVICE OF VARIABLE CAPACITANCE

CROSS REFERENCE TO RELATED APPLICATIONS

This application claims the priority benefit of French patent application number 12/50438, filed on Jan. 17, 2012, which is hereby incorporated by reference to the maximum extent allowable by law.

BACKGROUND

1. Technical Field

The present disclosure relates to a variable capacitance device, and to a method of varying the capacitance of a variable capacitance device.

2. Discussion of the Related Art

Variable capacitance devices are used in a variety of applications, such as in the tuning circuits of voltage or digitally controlled oscillators used in wireless communication systems. It is often an aim of such variable capacitance devices to have a very fine step size between each capacitance value. In particular, in some applications it is desirable to attain a step size as low as 1 aF (AttoFarad, equal to $10^{-18}$ Farads).

However, existing solutions of variable capacitor devices are generally unable to achieve such a low step size, and/or they are unable to maintain such a low step size over a range of operating conditions. Existing solutions also tend to be complex to implement, and/or consuming in terms of chip area.

There is thus a need for a variable capacitance device having a low step size and being relatively simple in terms of its implementation and layout.

SUMMARY

It is an aim of embodiments to at least partially address one or more needs in the prior art.

According to one aspect, there is provided a variable capacitance device comprising: first and second transistors coupled in series by their main current nodes between first and second nodes of said device, a control node of said first transistor being adapted to receive a first control signal, and a control node of said second transistor being adapted to receive a second control signal; and control circuitry adapted to generate said first and second control signals from a selection signal.

According to one embodiment, the control circuitry is configured, in response to a first value of said selection signal, to generate a first voltage level for each of said first and second control signals, and in response to a second value of said selection signal, to generate a second voltage level for said first control signal, and to generate said first voltage for said second control signal.

According to another embodiment, in response to a first value of said selection signal said control circuitry is configured to deactivate said first and second transistors, and in response to a second value of said selection signal said control circuitry is configured to activate said first transistor and deactivate said second transistor.

According to another embodiment, the variable capacitance device further comprises a third transistor coupled by its main current nodes in series with said first and second transistors between the first and second nodes, a control node of the third transistor being adapted to receive a third control signal generated by said control circuitry.

According to another embodiment, the control circuitry is configured to generate, in response to a first value of said selection signal, control signals that deactivate at least two of said first, second and third transistors, and in response to a second value of said selection signal, control signals that activate at least two of said first, second and third transistors.

According to another embodiment, in response to said second value of said selection signal, the control circuitry is configured to generate control signals that activate said first and second transistors and deactivate said third transistor.

According to another embodiment, the control circuitry comprises a connection coupling said control signal to the control node of said first transistor, an OR gate adapted to receive at its two inputs said control signal and having its output coupled to the control node of said second transistor, and a XOR gate having a first input adapted to receive the output of said OR gate, a second input adapted to receive said control signal, and an output coupled to the control node of said third transistor.

According to another embodiment, the variable capacitance device is configured such that the capacitance between the first and second nodes differs for the first and second values of said selection signal by 1 aF or less.

According to another embodiment, the variable capacitance device further comprises: a fourth transistor coupled by its main current nodes between said first node and a supply voltage; a fifth transistor coupled by its main current terminals between a first intermediate node between said first and second transistors and said supply voltage; a sixth transistor coupled by its main current terminals between said first intermediate node and said supply voltage; a seventh transistor coupled by its main current terminals between said second node and said supply voltage; the control nodes of said fourth and fifth transistors being adapted to receive said first control signal, and the control nodes of said sixth and seventh transistors being adapted to receive said second control signal.

According to another embodiment, the variable capacitance device further comprises: a fourth transistor coupled by its main current nodes between said first node and a supply voltage; a fifth transistor coupled by its main current terminals between a first intermediate node between said first and second transistors and said supply voltage; a sixth transistor coupled by its main current terminals between said first intermediate node and said supply voltage; a seventh transistor coupled by its main current terminals between a second intermediate node between said second and third transistors and said supply voltage; an eighth transistor coupled by its main current terminals between said second intermediate node and said supply voltage; and a ninth transistor coupled by its main current nodes between said second node and said supply voltage; wherein the control nodes of said fourth and fifth transistors are adapted to receive said first control signal, the control nodes of said sixth and seventh transistors are adapted to receive said second control signal, and control nodes of said eighth and ninth transistors are adapted to receive said third control signal.

According to another embodiment, the variable capacitance device further comprises a capacitor connected between said first and second nodes.

According to another embodiment, the first and second transistors are both n-channel MOS transistors formed in a same p-type semiconductor well, or the first and second transistors are both p-channel MOS transistors formed in a same n-type semiconductor well.

According to a further aspect, there is provided an electronic device comprising: the above variable capacitance device; and a selection block configured to generate the selection signal for selecting a capacitance of said variable capacitance device.

According to a further aspect, there is provided a digitally controlled oscillator comprising: at least one inductor; at least one of the above variable capacitance device.

According to a further aspect, there is provided a method of varying the capacitance between first and second nodes coupled together by first and second transistors coupled in series, the method comprising: generating, by control circuitry, first and second control signals based on a selection signal; and applying said first control signal to a control node of said first transistor and said second control signal to a control node of said second transistor.

According to one embodiment, the method comprises: in response to a first value of said selection signal, deactivating by said control circuitry said first and second transistors; and in response to a second value of said selection signal, activating by said control circuitry said first transistor and deactivate by said control circuitry said second transistor.

According to one embodiment, the first and second nodes are further coupled together by a third transistor coupled in series with said first and second transistors, the method comprising: generating, by said control circuitry, a third control signal based on said selection signal; and applying said third control signal to a control node of said second transistor.

According to one embodiment, in response to a first value of said selection signal, the first, second and third control signals are generated such that at least two of said first, second and third transistors are deactivated, and in response to a second value of said selection signal, the first, second and third control signals are generated such that at least two of said first, second and third transistors are activated.

BRIEF DESCRIPTION OF THE DRAWINGS

The foregoing and other purposes, features, aspects and advantages of the embodiments described herein will become apparent from the following detailed description, given by way of illustration and not limitation with reference to the accompanying drawings, in which.

DETAILED DESCRIPTION

Figure 1A:
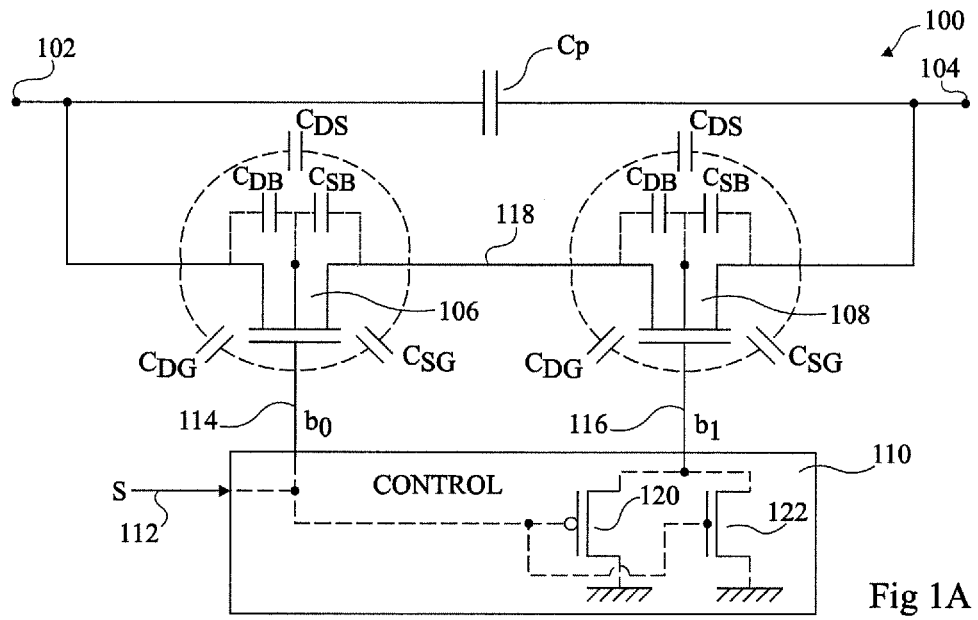
FIG. 1A schematically illustrates a variable capacitance device according to an embodiment.

FIG. 1A illustrates a variable capacitance device 100 comprising nodes 102 and 104 between which a pair of transistors 106, 108 are coupled in series by their main current nodes. For example, transistor 106 has is drain coupled to node 102, and its source coupled to the drain of transistor 108, and transistor 108 has its source coupled to node 104. The transistors 106, 108 are for example formed in a same semiconductor well (not shown in the figures), and have their bulks connected to ground. In the example of FIG. 1A, both of the transistors are n-channel MOS transistors, and they are for example arranged in a common p-type well. In alternative embodiments, both of the transistors could be p-channel MOS transistors, for example arranged in a common n-type well.

A capacitor $C_P$ is optionally coupled between nodes 102 and 104, in parallel with the transistors 106, 108. One or more further capacitors, not illustrated in FIG. 2, may also be coupled in parallel with transistors 106, 108, for example each in series with a switch allowing it to be selected or not, thereby permitting a further selectable capacitance variation.

A control block 110 receives a selection signal S on a line 112 selecting a desired capacitance of the variable capacitance device, and based on this selection signal S, the control block 110 is configured to generate control signals $b_0$ and $b_1$, which are applied on lines 114 and 116 to the gate nodes of the transistors 106, 108 respectively for activating or deactivating each of these transistors.

In operation, the control block 110 controls, based on the selection signal S, whether neither, one and/or both of the transistors 106, 108 is conducting. Each transistor has certain parasitic capacitances associated therewith, the values of which depend on the conduction state of the transistors. FIG. 1A illustrates an example of these parasitic capacitances associated with each transistor 106, 108. In particular, each transistor for example has:

a drain to source capacitance $C_{DS}$;
a drain to bulk capacitance $C_{DB}$;
a drain to gate capacitance $C_{DG}$;
a source to bulk capacitance $C_{SB}$; and
a source to gate capacitance $C_{SG}$.

Figure 1B:
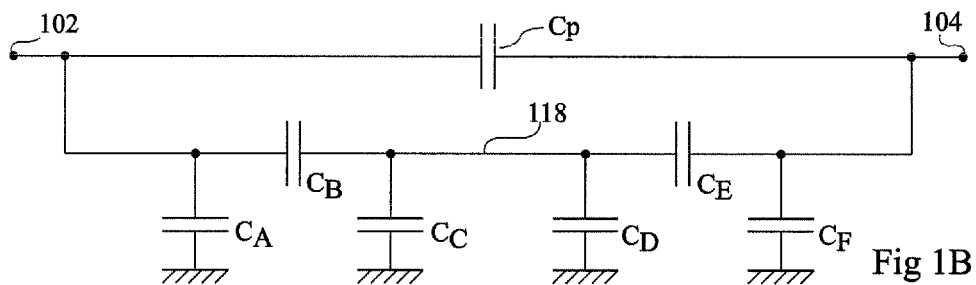
FIG. 1B represents capacitances present in the circuit of FIG. 1A.

Now with reference to FIG. 1B, the parasitic capacitances associated with each transistor 106, 108 can be grouped and represented by equivalent capacitors $C_A$ to $C_F$ as illustrated, capacitor $C_A$ being positioned between node 102 and ground, capacitor $C_B$ being positioned between node 102 and an intermediate node 118 between the transistor 106, 108, capacitors $C_C$ and $C_D$ being positioned between node 118 and ground, capacitor $C_E$ being positioned between node 118 and node 104, and capacitor $C_F$ being positioned between node 104 and ground. The capacitances of these capacitors are for example as follows:

$C_A = C_{DG} + C_{DB}$ of transistor 106;

$C_B = C_{DS}$ of transistor 106;

$C_C = C_{SG} + CSB$ of transistor 106;

$C_D = C_{DG} + C_{DB}$ of transistor 108;

$C_E = C_{DS}$ of transistor 108;

$C_F = C_{SG} + C_{SB}$ of transistor 108.

The four possible states of the control signals $b_0$ and $b_1$ for example result in the following capacitances $C_{TOTOL}$ between nodes 102 and 104 as shown in the following table

TABLE I

| $b_0$ | $b_1$ | $C_{TOTOL}$ |
|---|---|---|
| 0 | 0 | $C_0$ |
| 1 | 0 | $C_1$ |
| 0 | 1 | $C_2$ |
| 1 | 1 | $C_3$ |

Assuming that the transistors 102 and 104 are identical, capacitance $C_0$ when both transistors 106, 108 are off will be as follows:

$$C_0 = C_P + C_{DSOFF}/2 + 2(C_{DGOFF} + C_{DBOFF} + C_{SGOFF} + C_{SBOFF})$$

where "OFF" in each term indicates that this value corresponds to the off state of the transistor 106, 108. Further, the capacitance $C_1$ and $C_2$ will each be as follows:

$$C_1, C_2 = C_P + C_{DSON}C_{DSOFF}/(C_{DSON} + C_{DSOFF}) + (C_{DGON} + C_{DGOFF} + C_{DBON} + C_{DBOFF} + C_{SGON} + C_{SGOFF} + C_{SBON} + C_{SBOFF})$$

where "ON" in certain terms indicates that this value corresponds to the conducting state of the transistor 106, 108. Furthermore, the capacitance $C_3$ will be as follows:

$$C_3 = C_P + (C_{DSON}/2 + 2(C_{DGON} + G_{DBON} + C_{SGON} + C_{SBON}))$$

In one example, assuming a capacitance $C_P$ of 10 fF, and assuming transistor dimensions of 0.04 μm in length and 0.12 μm in width, the value of $C_0$ is substantially equal to 10 fF, the value of $C_1$ is 3 aF greater than $C_0$ and the values of $C_2$ and $C_3$ are each 40 aF greater than $C_0$.

The difference $\Delta C$ between the capacitance $C_0$ and the capacitances $C_1$, $C_2$ is equal to:

$$\Delta C = C_{DSON}C_{DSOFF}/(C_{DSON} + C_{DSOFF}) - C_{DSOFF}/2 + C_{DGON} - C_{DGOFF} + C_{DBON} - C_{DBOFF} + C_{SGON} - C_{SGOFF} + C_{SBON} - C_{SBOFF}$$

While in some embodiments the selection signal S selects between the four states of the control signals $b_0$, $b_1$, and thus between the four capacitance values $C_0$, $C_1$, $C_2$ and $C_3$, in an alternative embodiment, only the states in the first two rows of the above table are used. In such an example, the selection signal S has just two states high or low. When low, the control signals $b_0$, $b_1$ are for example both low, and when high, the control signal $b_0$ is for example high and the control signal $b_1$ is for example low. Throughout the present application, a high control signal or selection signal is for example at 1 V, and a low control signal or selection signal is for example at 0 V, although other voltage levels would be possible.

An example implementation of the control block 110 for implementing the above functionality is illustrated by dashed lines in FIG. 1A. The control block 110 for example comprises a connection between the selection input line 112 and the control line 114, such that the control signal $b_0$ is generated to be equal to the selection signal S. Furthermore, the control block 110 for example comprises a p-channel MOS transistor 120 and an n-channel MOS transistor 122, each coupled between the line 116 and ground, and each receiving at its gate node the selection signal S. Thus one or the other of transistors 120, 122 is activated, and the other is deactivated, by either of the states of the selection signal S, implying that the control signal $b_1$ is always low.

Figure 2:
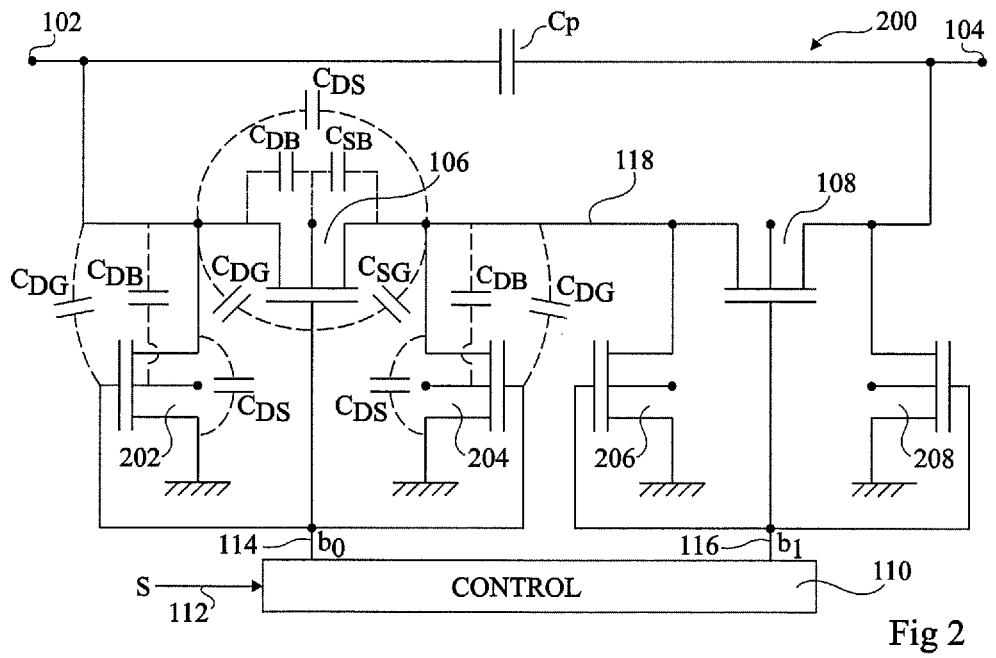
FIG. 2 schematically illustrates a variable capacitance device according to a further embodiment.

FIG. 2 illustrates an alternative embodiment 200 of a variable capacitance device, which is similar to the embodiment of FIG. 1A, and like features are labelled with like reference numerals and will not be described again in detail.

In the embodiment of FIG. 2, each of the transistors 106, 108 is associated with a further two transistors coupled respectively between the drain and source nodes of transistor 106, 108 and the ground node. In particular, an n-channel MOS transistor 202 is coupled by its main current nodes between node 102 and ground, and an n-channel MOS transistor 204 is coupled by its main current nodes between the intermediate node 118 and ground. For example, transistor 202 has its drain coupled to node 102, and its source coupled to ground, and transistor 204 has its drain coupled to node 118, and its source coupled to ground. Similarly, an n-channel MOS transistor 206 is coupled by its main current nodes between intermediate node 118 and ground, and an n-channel MOS transistor 208 is coupled by its main current nodes between node 104 and ground. For example, transistor 206 has its drain coupled to node 118, and its source coupled to ground, and transistor 208 has its drain coupled to node 104, and its source coupled to ground. All of the transistors 106, 108 and 202 to 208 are for example all formed in a common p-type well. The gate nodes of transistors 202 and 204 are coupled to receive the control signal $b_0$, and the gate nodes of transistors 206 and 208 are coupled to receive the control signal $b_1$.

In an alternative embodiment in which the transistors 106 and 108 are for example p-channel MOS transistors, the transistors 202 to 208 are likewise p-channel MOS transistors coupled to the high supply voltage rail rather than to ground, and all of the transistors are for example formed in a common n-type well.

The additional transistors 202 to 208 modify the parasitic capacitances associated with the nodes 102 and 104. In particular, each of the transistors 202 to 208 will have an associated capacitance $C_{DS}$ between its drain and ground, an associated capacitance $C_{DB}$ between its drain and its bulk, and an associated capacitance $C_{DG}$ between its drain and its gate. The equivalent capacitors $C_A$ to $C_F$ represented in FIG. 1B described above will thus have the following values, assuming that each transistor 106, 108 and 202 to 208 is identical:

$$C_A = C_{DG} + 2C_{DB} + C_{DS};$$

$$C_B = C_{DS};$$

$$C_C = C_{DG} + C_{SG} + C_{SB} + C_{DS};$$

$$C_D = C_{DG} + 2C_{DB} + C_{DS};$$

$$C_E = C_{DS};$$

$$C_F = C_{DG} + C_{SG} + C_{SB} + C_{DS};$$

Thus, with reference again to the above table I, the capacitance $C_0$ when both signals $b_0$ and $b_1$ are low will be as follows:

$$C_0 C_P + C_{DSOFF}/2 + 2(2C_{DGOFF} + 2C_{DBOFF} + C_{SGOFF} + C_{SBOFF} + 2C_{DSOFF})$$

where "OFF" in each term indicates that this value corresponds to the non-conducting state of the corresponding transistor 106, 108, 202 to 208. The capacitances $C_1$ and $C_2$ will each be as follows:

$$C_1, C_2 = C_P + C_{DSON}C_{DSOFF}/(C_{DSON} + C_{DSOFF}) + (C_{DGON} + C_{DGOFF} + C_{DBON} + C_{DBOFF} + C_{SGON} + C_{SGOFF} + C_{SBON} + C_{SBOFF} + 2C_{DSON} + 2C_{DSOFF})$$

where "ON" in certain terms indicates that this value corresponds to the conducting state of the corresponding transistor 106, 108, 202 to 208. The capacitance $C_3$ will be as follows:

$C_3 = C_P + C_{DSON}/2 + 2(2C_{DGON} + 2C_{DBON} + C_{SGON} + C_{SBON} + 2C_{DSON})$

Thus, the difference $\Delta C$ between the capacitance $C_0$ and the capacitances $C_1$, $C_2$ is equal to:

$\Delta C = C_{DSON}C_{DSOFF}/(C_{DSON} + C_{DSOFF}) - C_{DSOFF}/2 + C_{DGON} - 3C_{DGOFF} + C_{DBON} - 3C_{DBOFF} + C_{SGON} - C_{SGOFF} + C_{SBON} - C_{SBOFF} + C_{DSON} - 3C_{DSOFF}$ As with the example of FIG. 1A, in the embodiment of FIG. 2, the selection signal S may select between the four states of the control signals $b_0$, $b_1$ of table I and thus between the four capacitance values $C_0$, $C_1$, $C_2$ and $C_3$. However, in an alternative embodiment, only the states in the first two rows of table I are used, and the control circuit 110 of FIG. 2 for example comprises the same circuitry as shown in the example of FIG. 1A.

Figure 3:
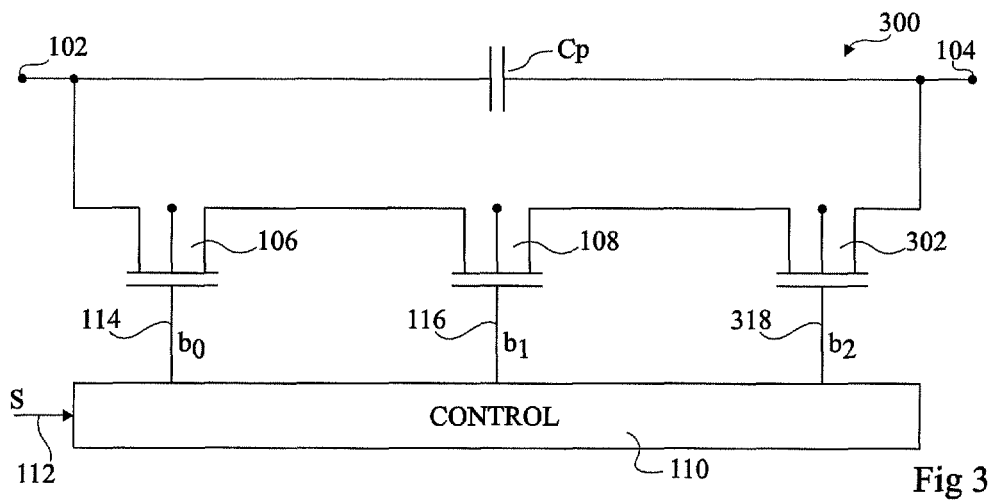
FIG. 3 schematically illustrates a variable capacitance device according to a further embodiment.

FIG. 3 illustrates an alternative embodiment of a variable capacitance device 300, which is identical to the embodiment of FIG. 1A, except that it additionally comprises a further series-coupled transistor 302 coupled by its main current nodes between transistor 108 and node 104. For example, transistor 302 has its drain coupled to the source of transistor 108, and its source coupled to node 104. The control circuitry 110 thus generates three control signals $b_0$, $b_1$ and $b_2$ on lines 114, 116 and 318 respectively for controlling transistors 106, 108 and 302.

Thus there are eight possible states of the control signal $b_0$, $b_1$ and $b_2$. Those skilled in the art will understand how the calculations for the sums of the parasitic capacitances described above in relation to FIG. 1A for the case of two series-coupled transistors could be extended to three series-coupled transistors, and for the sake of brevity, the calculations will not be repeated.

In some embodiments, the selection signal S could select between these eight states of the control signals $b_0$, $b_1$, $b_2$. In an alternative embodiment, only the states in the first and fourth rows of the above table are for example used. In such an example, the selection signal S has just two states high or low. For example, if the selection signal S is low, all three control signals are low, and if the selection signal S is high, the control signals $b_0$ and $b_1$ are high, and the control signal $b_2$ is low. Circuitry for implementing this functionality will now be described in relation to FIG. 4.

Figure 4:
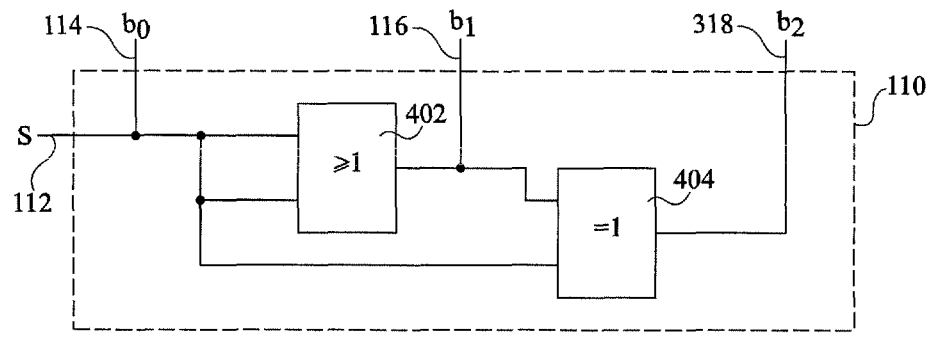
FIG. 4 schematically illustrates control logic of the variable capacitance device of FIG. 3 according to an embodiment.

FIG. 4 illustrates an example of circuitry forming the control block 110 in the embodiment of FIG. 3. The selection line 112 is coupled to the control line 114, and to the inputs of an OR gate 402, having its output coupled to the control line 116. The output of OR gate 402 and the line 112 are also coupled to corresponding inputs of an XOR gate 404, the output of which is coupled to the control line 318. Thus the control signals $b_0$ and $b_1$ are both equal to the selection signal S, and the control signal $b_2$ is always low.

Figure 5:
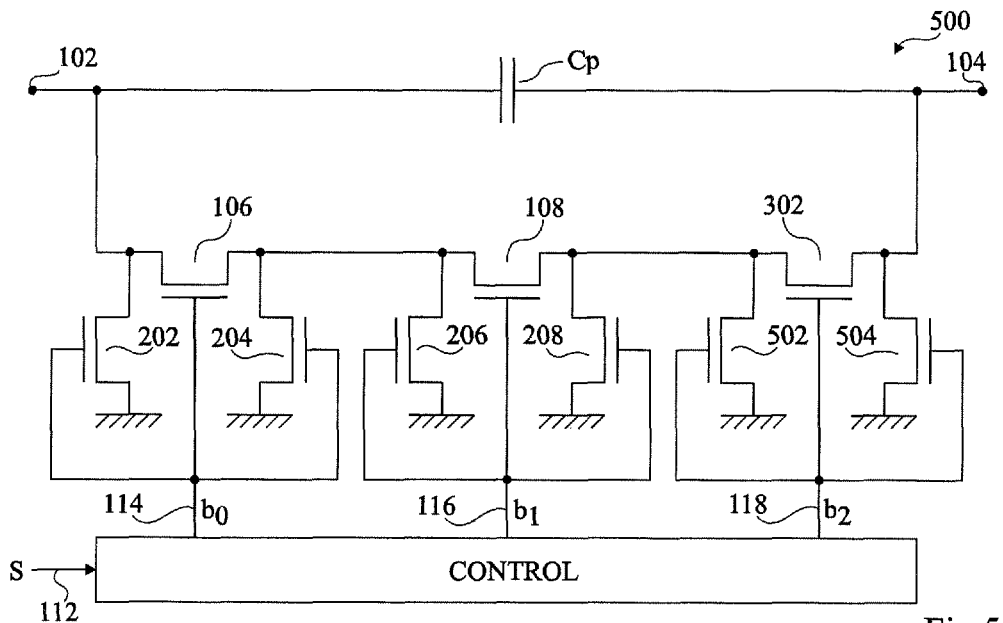
FIG. 5 schematically illustrates a variable capacitance device according to yet a further embodiment.

FIG. 5 illustrates an alternative embodiment of a variable capacitance device 500, which is identical to the embodiment of FIG. 3, except that it additionally comprises the transistors 202 to 208 of FIG. 2 coupled between the source/drain nodes of transistors 106, 108 and ground, and further comprises transistors 502, 504 respectively coupled between the drain and source nodes of transistor 302 and ground.

Again, those skilled in the art will understand how the calculations for the sums of the parasitic capacitances described above in relation to FIG. 2 for the case of two series-coupled transistors could be extended to three series-coupled transistors. Table II below provides, for the different states of the control signals $b_0$, $b_1$ and $b_2$, some example capacitance variations $\Delta C$ with respect to the state in which all the transistors are deactivated (first row in table II). The example assumes a capacitance of capacitor $C_P$ of 10 ff, a transistor gate length of 0.04 μm and a gate width of 0.12 μm of transistors 106, 108, 202 to 208, 502 and 504.

TABLE II

| $b_0$ | $b_1$ | $b_2$ | $\Delta C$ |
|---|---|---|---|
| 0 | 0 | 0 | 0 |
| 1 | 0 | 0 | 0 |
| 0 | 1 | 0 | 0 |
| 0 | 0 | 1 | 0 |
| 1 | 1 | 0 | 1 aF |
| 0 | 1 | 1 | 1 aF |
| 1 | 0 | 1 | 2 aF |
| 1 | 1 | 1 | 30 aF |

Figure 6:
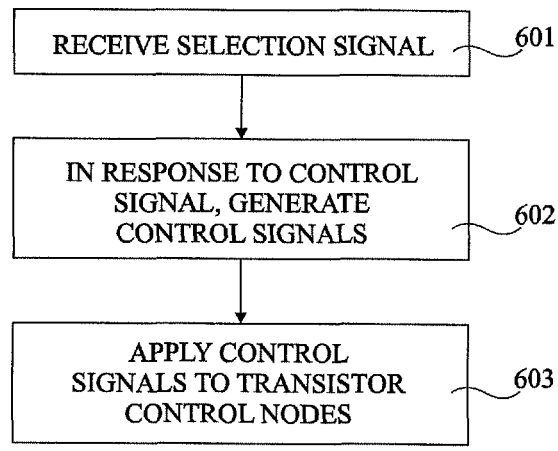
FIG. 6 is a flow diagram illustrating steps in a method of varying the capacitance between nodes of a variable capacitance device.

FIG. 6 is a flow diagram illustrating operations in a method of varying the capacitance between nodes of a variable capacitance device.

In an operation 601, the selection signal S is received by the control block 110 of FIG. 1A, 2, 3 or 5.

In a subsequent operation 602, in response to the selection signal S, the control block 110 generates the control signals b0, b1 in the embodiments of FIGS. 1A and 2, or the control signals $b_0$, $b_1$ and $b_2$ in the embodiments of FIGS. 3 and 5.

In a subsequent operation 603, the generated control signals are applied to the control nodes of the corresponding transistors.

Figure 7:
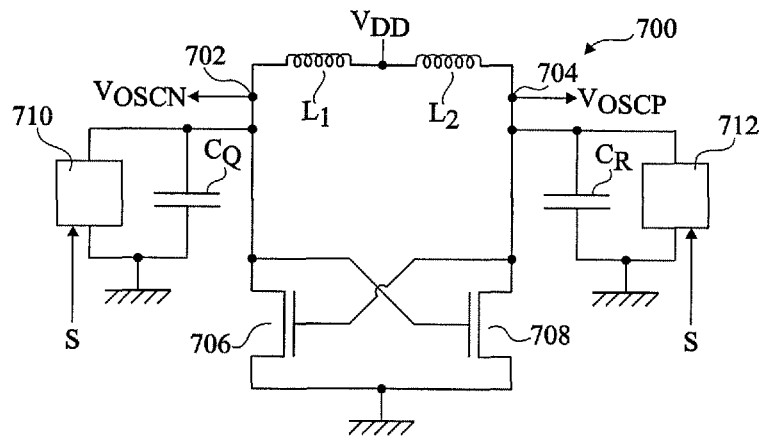
FIG. 7 schematically illustrates a digitally controlled oscillator according to an embodiment.

FIG. 7 illustrates a digitally controlled oscillator 700 according to an embodiment of the present disclosure.

Digitally controlled oscillators are for example described in more detail in the publication entitled "A Digitally Controlled Oscillator in a 90 nm Digital CMOS Process for Mobile Phones", R. B. Staszewski et al., IEEE publication, vol. 40, N° 11, November 2005, the contents of which are hereby incorporated by reference to the extent permitted by the law.

Digitally controlled oscillator 700 comprises inductors $L_1$ and $L_2$, each coupled between a supply voltage $V_{DD}$ and respective output nodes 702 and 704. Nodes 702 and 704 are further coupled to a pair of cross-coupled transistors 706, 708, transistor 706 being coupled between node 702 and the ground voltage, and transistor 708 being coupled between node 704 and the ground voltage. The gate node of transistor 706 is coupled to node 704, while the gate node of transistor 708 is coupled to node 702.

A capacitor $C_Q$ and a variable capacitance device 710 are each coupled between node 702 and the ground voltage. Furthermore, a capacitor $C_R$ and a variable capacitance device 712 are each coupled between node 704 and the ground voltage. The variable capacitance devices 710 and 712 for example each correspond to one of the variable capacitance devices described herein, and each receives a same selection signal S. Thus, in operation, the capacitance value at nodes 702 and 704 may be finely tuned between two or more states, based on the selection signal S, and thus lead to a fine control of the frequency at the output of the oscillator 700. In particular, the frequency f of the oscillator is determined as follows:

$$f = \frac{1}{2\pi\sqrt{LC}}$$

where L is the inductance of each of the inductors $L_1$, $L_2$, and C is the capacitance of each of the variable capacitance devices 710, 712. Thus the difference in frequencies $f_0$ and $f_1$ for the low and high states of the selection signal S is as follows:

$$\Delta f = \frac{1}{2\pi\sqrt{LC_L}} - \frac{1}{2\pi\sqrt{LC_H}}$$

where $C_L$ and $C_H$ are the capacitances of the variable capacitance devices 710, 711 for first and second states respectively of the selection signal S, which are for example high and low states when the control block 110 is implemented by the circuit shown in FIG. 1A or FIG. 4. As an example, assuming an inductance L of around 1 nH and a capacitance $C_L$ of around 10 fF, the frequency f would be in the order of 5 GHz. Assuming also a difference between the capacitance values $C_L$ and $C_H$ of around 1 aF, this would lead to a frequency step in the order of 100 kHz.

Figure 8:
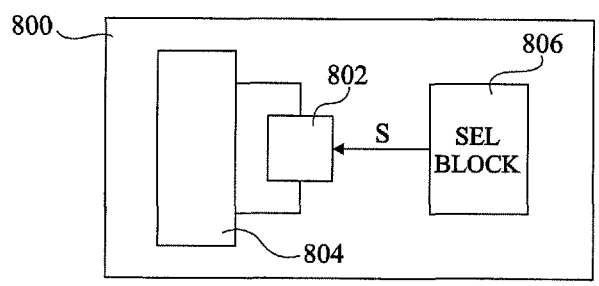
FIG. 8 schematically illustrates an electronic device comprising a variable capacitance device according to an embodiment.

FIG. 8 illustrates an electronic device 800 comprising a variable capacitance device 802, which is for example one of the variable capacitance devices described herein. Device 802 is coupled to a circuit 804, which is for example a digitally controlled oscillator as described in relation to FIG. 7, or a different type of circuit such as a filter, which uses a variable capacitance device. Device 802 receives the selection signal S, which is for example provided by a selection block 806. The selection signal S is for example generated based on any of a number of control techniques, such as a feedback loop etc.

An advantage of the embodiments described herein is that, by forming a variable capacitance device of two or more series coupled capacitors, a simple circuit is achieved that allows one of a plurality of capacitance values to be selected in a simple fashion, with a small step size between the capacitance values, for example of 1 aF or less.

Advantageously, the control circuitry generates control signals in response to a first state of the selection signal that deactivate at least two of the series coupled transistors, and it generates control signals in response to a second state of the selection signal that activate at least one of the series coupled transistors in the case that there are two of them, or at least two of the series coupled transistors in the case that there are three or more of them. The present inventors have found that the capacitances associated with these two activation states of the series coupled transistors have a particularly low step size.

Furthermore, a fine step size can be achieved by additionally coupling transistors between the drain and source nodes of each series-coupled transistor and a supply voltage such as ground.

Furthermore, advantageously the transistors 106, 108, 202 to 208, 302, 502 and/or 504 are all identical, d thus well-matched, such that a fine step size can be achieved over such a range of conditions. Furthermore, these transistors are for example formed in a same semiconductor well of the variable capacitance device.

Having thus described at least one illustrative embodiment, various alterations, modifications and improvements will readily occur to those skilled in the art.

For example, it will be apparent to those skilled in the art that while the embodiments of FIG. 1A and FIG. 3 illustrate examples in which respectively two and three transistors are coupled in series, these embodiments could be extended to more than three transistors coupled in series, for example four, five or more. Likewise, while the embodiments of FIGS. 2 and 5 illustrates examples in which respectively two and three groups of transistors are present, each transistor group comprising a series-coupled transistor 106/108 and two adjacent transistors 202, 204/206, 208, these embodiments could also be extended to more than three transistor groups, such as four, five or more.

Furthermore, while embodiments of a variable resistance device comprising n-channel MOS transistors have been described, it will be apparent to those skilled in the art that the embodiments could instead use p-channel MOS transistors. In such a case, the transistors 202 to 208 and/or 502, 504 are for example coupled to a high supply voltage rather than to ground. Furthermore, the transistor technology could be different from MOS, for example bipolar.

The various features described in relation to the various embodiments could be combined, in alternative embodiments, in any combination.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A variable capacitance device comprising:
first and second transistors coupled in series by their main current nodes between first and second nodes of said device, a control node of said first transistor being adapted to receive a first control signal, and a control node of said second transistor being adapted to receive a second control signal; and
control circuitry adapted to generate said first and second control signals from a selection signal, the control circuitry including a connection line coupling the selection signal to the control node of said first transistor, and a logic gate adapted to receive the selection signal and coupled to the control node of said second transistor, wherein said control circuitry is configured, in response to a first value of said selection signal, to generate a first voltage level for each of said first and second control signals, and in response to a second value of said selection signal, to generate a second voltage level for said first control signal, and to generate said first voltage level for said second control signal.

2. The variable capacitance device of claim 1, wherein in response to a first value of said selection signal said control circuitry is configured to deactivate said first and second transistors, and in response to a second value of said selection signal said control circuitry is configured to activate said first transistor and deactivate said second transistor.

3. A variable capacitance device comprising:
first and second transistors coupled in series by their main current nodes between first and second nodes of said device, a control node of said first transistor being adapted to receive a first control signal, and a control node of said second transistor being adapted to receive a second control signal;
a third transistor coupled by its main current nodes in series with said first and second transistors between the first and second nodes, a control node of the third transistor being adapted to receive a third control signal generated by said control circuitry; and
control circuitry adapted to generate said first, second, and third control signals from a selection signal, the control circuitry including a connection coupling said selection signal to the control node of said first transistor, an OR gate having two inputs adapted to receive said selection signal and having an output coupled to the control node of said second transistor, and a XOR gate having a first input adapted to receive an output signal from said OR gate, a second input adapted to receive said selection signal, and an output coupled to the control node of said third transistor.

4. The variable capacitance device of claim 3, wherein said control circuitry is configured to generate, in response to a first value of said selection signal, control signals that deactivate at least two of said first, second and third transistors, and in response to a second value of said selection signal, control signals that activate at least two of said first, second and third transistors.

5. The variable capacitance device of claim 4, wherein in response to said second value of said selection signal, said control circuitry is configured to generate control signals that activate said first and second transistors and deactivate said third transistor.

6. The variable capacitance device of claim 1, configured such that the capacitance between said first and second nodes differs for said first and second values of said selection signal by 1 aF or less.

7. A variable capacitance, comprising:
first and second transistors coupled in series by their main current nodes between first and second nodes of said device, a control node of said first transistor being adapted to receive a first control signal, and a control node of said second transistor being adapted to receive a second control signal;
control circuitry adapted to generate said first and second control signals from a selection signal, the control circuitry including a connection line coupling the selection signal to the control node of said first transistor, and a logic gate adapted to receive the selection signal and coupled to the control node of said second transistor;
a third transistor coupled by its main current nodes between said first node and a supply voltage;
a fourth transistor coupled by its main current terminals between a first intermediate node between said first and second transistors and said supply voltage;
a fifth transistor coupled by its main current terminals between said first intermediate node and said supply voltage; and
a sixth transistor coupled by its main current terminals between said second node and said supply voltage;
wherein the control nodes of said third and fourth transistors are adapted to receive said first control signal, and the control nodes of said fifth and sixth transistors are adapted to receive said second control signal.

8. The variable capacitance device of claim 3, further comprising:
a fourth transistor coupled by its main current nodes between said first node and a supply voltage;
a fifth transistor coupled by its main current terminals between a first intermediate node between said first and second transistors and said supply voltage;
a sixth transistor coupled by its main current terminals between said first intermediate node and said supply voltage;
a seventh transistor coupled by its main current terminals between a second intermediate node between said second and third transistors and said supply voltage;
an eighth transistor coupled by its main current terminals between said second intermediate node and said supply voltage; and
a ninth transistor coupled by its main current nodes between said second node and said supply voltage;
wherein the control nodes of said fourth and fifth transistors are adapted to receive said first control signal, the control nodes of said sixth and seventh transistors are adapted to receive said second control signal, and control nodes of said eighth and ninth transistors are adapted to receive said third control signal.

9. The variable capacitance device of claim 1, further comprising a capacitor connected between said first and second nodes.

10. The variable capacitance device of claim 1, wherein said first and second transistors are both n-channel MOS transistors formed in a same p-type semiconductor well, or wherein said first and second transistors are both p-channel MOS transistors formed in a same n-type semiconductor well.

11. The variable capacitance device of claim 1, further comprising a selection block configured to generate the selection signal for selecting a capacitance of said variable capacitance device.

12. A digitally controlled oscillator comprising:
at least one inductor;
first and second transistors coupled in series by their main current nodes between first and second nodes of said device, a control node of said first transistor being adapted to receive a first control signal, and a control node of said second transistor being adapted to receive a second control signal; and
control circuitry adapted to generate said first and second control signals from a selection signal, the control circuitry including a connection line coupling the selection signal to the control node of said first transistor, and a logic gate adapted to receive the selection signal and coupled to the control node of said second transistor, wherein said control circuitry is configured, in response to a first value of said selection signal, to generate a first voltage level for each of said first and second control signals, and in response to a second value of said selection signal, to generate a second voltage level for said first control signal, and to generate said first voltage level for said second control signal.

13. A method of varying the capacitance between first and second nodes coupled together by first and second transistors coupled in series, the method comprising:
generating, by control circuitry, first and second control signals based on a selection signal, wherein the first control signal is generated by coupling the selection signal to the first control signal; and
applying said first control signal to a control node of said first transistor and said second control signal to a control node of said second transistor coupled in series to the first transistor, wherein the generating includes:
generating, in response to a first value of said selection signal, a first voltage level for each of said first and second control signals, and
generating, in response to a second value of said selection signal, a second voltage level for said first control signal, and generating said first voltage level for said second control signal.

14. The method of claim 13, comprising:
in response to a first value of said selection signal, deactivating by said control circuitry said first and second transistors; and in response to a second value of said selection signal, activating by said control circuitry said first transistor and deactivate by said control circuitry said second transistor.

15. The method of claim 13, wherein said first and second nodes are further coupled together by a third transistor coupled in series with said first and second transistors, the method comprising:

generating, by said control circuitry, a third control signal based on said selection signal; and applying said third control signal to a control node of said second transistor.

16. The method of claim 15, wherein in response to a first value of said selection signal, the first, second and third control signals are generated such that at least two of said first, second and third transistors are deactivated, and in response to a second value of said selection signal, the first, second and third control signals are generated such that at least two of said first, second and third transistors are activated.

17. The variable capacitance device of claim 1, wherein the capacitance of the variable capacitance device is based on the parasitic capacitance of the first transistor when the first control signal or the second control signal causes the first transistor to be turned off.

18. The variable capacitance device of claim 1, wherein the capacitance of the variable capacitance device is based on the parasitic capacitance of the second transistor when the first control signal or the second control signal causes the second transistor to be turned off.

19. The variable capacitance device of claim 1, wherein the first and second control signals in combination enable four capacitance values for the variable capacitance device.

20. The variable capacitance device of claim 3, wherein the first, second, and third control signals in combination enable eight capacitance values for the variable capacitance device.

21. The variable capacitance device of claim 1, configured such that the capacitance between said first and second nodes differs for said first and second values of said selection signal by 10 aF or less.

22. The variable capacitance device of claim 1, configured such that the capacitance between said first and second nodes differs for said first and second values of said selection signal by between 10 aF and 1 aF.

23. The variable capacitance device of claim 1, wherein the first control signal and the second control signal are both generated based on a single selection signal.

24. The variable capacitance device of claim 1, wherein the first and the second transistors are identical.

25. The variable capacitance device of claim 3, wherein each of the transistors is identical.

* * * * *